(12) United States Patent
Liu et al.

(10) Patent No.: US 11,043,180 B2
(45) Date of Patent: Jun. 22, 2021

(54) POWER SUPPLY CIRCUIT AND DISPLAY APPARATUS

(71) Applicants: BOE TECHNOLOGY GROUP CO., LTD., Beijing (CN); Hefei Xinsheng Optoelectronics Technology Co., Ltd., Anhui (CN)

(72) Inventors: Xiaoshi Liu, Beijing (CN); Min Wang, Beijing (CN); Yuanyuan Liu, Beijing (CN); Hui Dong, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 277 days.

(21) Appl. No.: 16/309,864

(22) PCT Filed: Apr. 3, 2018

(86) PCT No.: PCT/CN2018/081722
§ 371 (c)(1),
(2) Date: Dec. 13, 2018

(87) PCT Pub. No.: WO2019/037430
PCT Pub. Date: Feb. 28, 2019

(65) Prior Publication Data
US 2021/0012742 A1    Jan. 14, 2021

(30) Foreign Application Priority Data
Aug. 25, 2017  (CN) .......................... 201710742801.9

(51) Int. Cl.
*G09G 3/36*    (2006.01)
*H03K 7/08*    (2006.01)
*H03K 17/687*  (2006.01)

(52) U.S. Cl.
CPC ............. *G09G 3/3696* (2013.01); *H03K 7/08* (2013.01); *H03K 17/687* (2013.01); *G09G 2300/0809* (2013.01); *G09G 2330/021* (2013.01)

(58) Field of Classification Search
CPC . G09G 3/3696; G09G 2300/0809; H03K 7/08
See application file for complete search history.

(56) References Cited

U.S. PATENT DOCUMENTS 9,383,618 B2    7/2016  Luff
2012/0206944 A1*  8/2012  Yang ................. H02M 3/33507
                                              363/21.13

(Continued)

FOREIGN PATENT DOCUMENTS

CN    102331517 A    1/2012
CN    102590609 A    7/2012

(Continued)

OTHER PUBLICATIONS

International Search Report and Written Opinion dated Jun. 6, 2018, from application No. PCT/CN2018/081722.

*Primary Examiner* — Kevin M Nguyen
(74) *Attorney, Agent, or Firm* — Arch & Lake LLP

(57) ABSTRACT

The present disclosure provides a power supply circuit and a display apparatus. The power supply circuit includes a power management integrated circuit. The power management integrated circuit includes a driving pin configured to transmit a drive signal. The power management integrated circuit includes a power transistor with a control terminal connected to the driving pin, a first terminal connected to a first power source, and a second terminal connected to a load. The power transistor is configured to supply a voltage to the load.

14 Claims, 2 Drawing Sheets

(56) References Cited

U.S. PATENT DOCUMENTS

2014/0340127 A1* 11/2014 Kobayashi ......... H03K 19/0016
                                                                          327/109
2015/0220096 A1    8/2015  Luff

FOREIGN PATENT DOCUMENTS

| CN | 103604974 A | 2/2014 |
| CN | 102590609 B | 12/2015 |
| CN | 103604974 B | 3/2016 |
| CN | 105826902 A | 8/2016 |
| CN | 107565937 A | 1/2018 |

* cited by examiner

POWER SUPPLY CIRCUIT AND DISPLAY APPARATUS

CROSS-REFERENCE TO RELATED APPLICATIONS

This application is based upon International Application No. PCT/CN2018/081722, filed on Apr. 3, 2018, which claims the priority to the Chinese Patent Application No. 201710742801.9 entitled "POWER SUPPLY CIRCUIT AND DISPLAY APPARATUS" filed on Aug. 25, 2017, the entire content of which is incorporated herein by reference.

TECHNICAL FIELD

The present disclosure relates to the field of display technologies, and more particularly, to a power supply circuit and a display apparatus.

BACKGROUND

Liquid crystal modules are light in weight, thin in design, and small in power consumption, etc., and thus are widely used in modernized information devices such as TV sets, notebook computers, mobile phones, personal digital assistants, and so on. At present, with the continuous development of the liquid crystal module manufacturing technologies, there are increasing market demands for large-size and high-resolution liquid crystal modules.

Generally the liquid crystal modules need a power supply circuit to supply power. At present, a commonly-used power supply circuit includes a power management circuit (PMIC), which adopts a single die technique. A control part and a MOS transistor (metal-oxide-semiconductor field-effect transistor) are integrated on one die. The control part and the MOS transistor are integrated on one die, confined to existing technological conditions, the MOS transistor uses LDMOS (a laterally diffused metal oxide semiconductor).

The LDMOS is poor in performance, and its on-resistance may be hundreds of milliohms, which causes larger loss of the PMIC. Furthermore, with large size design of the liquid crystal modules, the loss of the PMIC is larger and larger, which causes the loss of the power supply circuit to be larger and larger.

It is to be noted that the above information disclosed in this Background section is only for enhancement of understanding of the background of the present disclosure and therefore it may contain information that does not form the prior art that is already known to a person of ordinary skill in the art.

SUMMARY

Arrangements of the present disclosure provide a power supply circuit and display apparatus.

According to an aspect of the present disclosure, there is provided a power supply circuit. The power supply circuit includes a power management integrated circuit. The power management integrated circuit includes a driving pin configured to transmit a drive signal. The power management integrated circuit includes a power transistor with a control terminal connected to the driving pin, a first terminal connected to a first power source, and a second terminal connected to a load. The power transistor is configured to supply a voltage to the load.

In an exemplary arrangement of the present disclosure, the power management integrated circuit further includes a detecting pin connected to the second terminal of the power transistor. The power management integrated circuit includes a detecting circuit with a current detecting terminal connected to the detecting pin. The detecting circuit is configured to detect a current flowing through the power transistor.

In an exemplary arrangement of the present disclosure, the detecting circuit includes a current mirror circuit. The current mirror circuit includes a first transistor with a control terminal and a first terminal both connected to the first power source and a second transistor with a control terminal and a first terminal both connected to the first power source.

In an exemplary arrangement of the present disclosure, the detecting circuit further includes a third transistor. The third transistor includes a control terminal connected to the first power source, a first terminal connected to a second terminal of the first transistor, and a second terminal connected to a second power source. The detecting circuit further includes a first switch. The first switch includes a first terminal connected a second terminal of the second transistor, and a second terminal connected to the current detecting terminal of the detecting circuit. The detecting circuit further includes a fourth transistor. The fourth transistor further includes a control terminal and a second terminal both connected to the second power source, and a first terminal connected to the current detecting terminal of the detecting circuit. The detecting circuit further includes a second switch. The second switch includes a first terminal connected to the second terminal of the second transistor, and a second terminal connected to the second power source. The detecting circuit further includes a fifth transistor. The fifth transistor includes a control terminal connected to the first terminal of the first transistor, a first terminal connected to a voltage detecting terminal of the detecting circuit, and a second terminal connected to the second terminal of the first transistor. The detecting circuit further includes a resistor. The resistor includes a first terminal connected to the first power source, and a second terminal connected to the voltage detecting terminal of the detecting circuit.

In an exemplary arrangement of the present disclosure, a state of the detecting circuit includes a detection state and a wait state. The first switch is turned on and the second switch is turned off in the detection state. The first switch is turned off and the second switch is turned on in the wait state.

In an exemplary arrangement of the present disclosure, the first transistor and the second transistor are equal in size.

In an exemplary arrangement of the present disclosure, a proportion of a size of the third transistor to a size of the fourth transistor is N. N>0 and N is determined by a ratio of a width-to-length ratio of the third transistor to that of the fourth transistor.

In an exemplary arrangement of the present disclosure, all of the first transistor, the second transistor, the third transistor, the fourth transistor and the fifth transistor are N-type thin-film transistors or P-type thin-film transistors.

In an exemplary arrangement of the present disclosure, the power transistor is an N-type power transistor or a P-type power transistor.

In an exemplary arrangement of the present disclosure, the drive signal transmitted by the driving pin is a pulse waveform having a variable duty cycle.

In an exemplary arrangement of the present disclosure, the power management integrated circuit is configured to control an output voltage of the second terminal of the power transistor by adjusting the duty cycle of the drive signal.

According to an aspect of the present disclosure, there is provided a display apparatus, which includes the power supply circuit according to any one of the above arrangements.

BRIEF DESCRIPTION OF THE DRAWINGS

The above and other features and advantages of the present disclosure will become more apparent by describing in detail the exemplary arrangements thereof with reference to the accompanying drawings. Apparently, the accompanying drawings in the following description show merely some arrangements of the present disclosure, and persons of ordinary skill in the art may still derive other drawings from these accompanying drawings without creative efforts. In the accompanying drawings.

DETAILED DESCRIPTION

Figure 1:
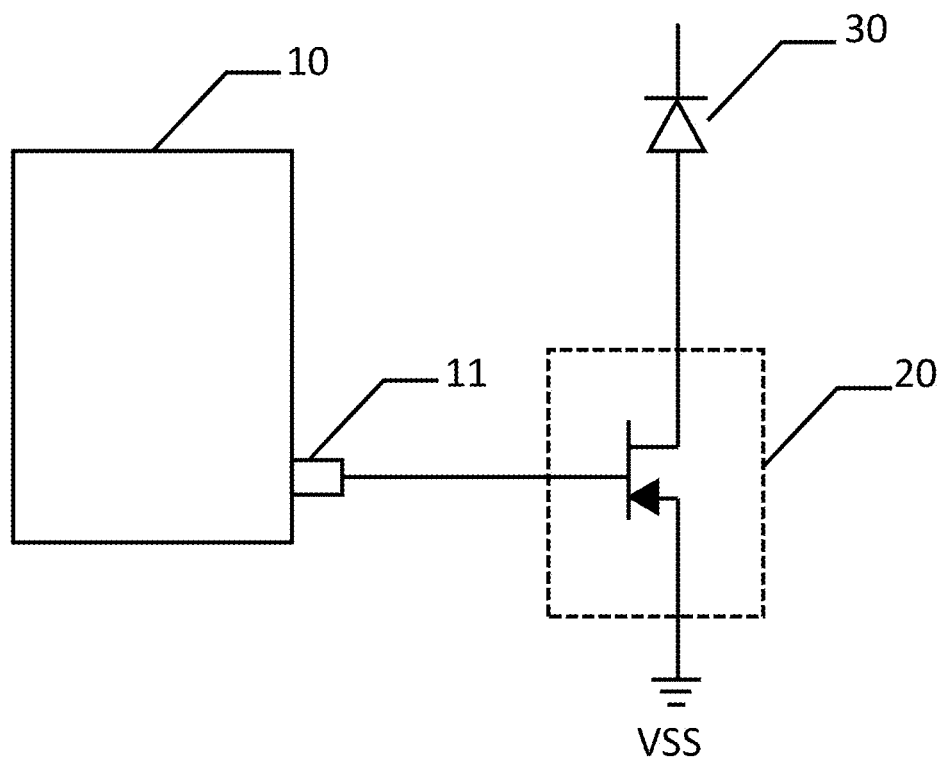
FIG. 1 is schematic diagram I of a power supply circuit according to an exemplary arrangement of the present disclosure.

The exemplary arrangement will now be described more fully with reference to the accompanying drawings. However, the exemplary arrangements can be implemented in a variety of forms and should not be construed as limited to the arrangements set forth herein. Rather, the arrangements are provided so that this disclosure will be thorough and complete and will fully convey the concepts of exemplary arrangements to those skilled in the art. The features, structures, or characteristics described may be combined in one or more arrangements in any suitable manner. In the following description, numerous specific details are provided to give a full understanding of the arrangements of the present disclosure. However, those skilled in the art will appreciate that the technical solutions of the present disclosure may be practiced without practicing one or more of the specific details, and other methods, components, materials, devices, steps, and the like may be employed. In other instances, well-known technical solutions are not shown or described in detail to avoid obscuring aspects of the present disclosure.

In addition, the accompanying drawings are merely exemplary illustration of the present disclosure, and are not necessarily drawn to scale. The same reference numerals in the drawings denote the same or similar parts, and thus repeated description thereof will be omitted.

This exemplary arrangement provides a power supply circuit. Referring to FIG. 1, the power supply circuit may include: a power management integrated circuit 10 and a power transistor 20.

The power management integrated circuit 10 may include a driving pin 11 configured to transmit a drive signal. The power transistor 20 is arranged outside the power management integrated circuit 10. A control terminal of the power transistor 20 is connected to the driving pin 11, a first terminal of the power transistor 20 is connected to a first power source VSS, and a second terminal of the power transistor 20 is connected to a load 30 to supply a voltage to the load 30.

In this exemplary arrangement, the drive signal transmitted by the driving pin 11 may be a pulse waveform having a variable duty cycle. The voltage of the drive signal may be determined based on the voltage of the power transistor 20. For example, when the power transistor 20 is a low-voltage power transistor having a voltage of 20V, the drive signal uses a pulse waveform having a variable duty cycle and a voltage of 4.5V. In addition, the power management integrated circuit (PMIC) 10 may control an output voltage of the second terminal of the power transistor 20 by adjusting the duty cycle of the drive signal.

The power transistor 20 may be a power field-effect transistor, or may be a power bipolar transistor. Furthermore, the power transistor 20 may be an enhancement mode transistor or may be a depletion-type transistor, which is not particularly limited in this exemplary arrangement.

The power transistor 20 has a control terminal, a first terminal, and a second terminal. For example, the control terminal of the power transistor 20 may be a gate, the first terminal of the power transistor 20 may be a source, and the second terminal of the power transistor 20 may be a drain. The first power source VSS outputs a low level if the power transistor 20 is an N-type power transistor. The first power source VSS outputs a high level if the power transistor 20 is a P-type power transistor. It is to be noted that the P-type power transistor is turned on when the gate is at a low level and is turned off when the gate is at a high level; and the N-type power transistor is turned off when the gate is at a low level and is turned on when the gate is at a high level.

In conclusion, compared with the prior art, by changing the structure of the power supply circuit, i.e., by arranging a power transistor 20 outside the power management integrated circuit (PMIC) 10 to replace LDMOS (a laterally diffused metal oxide semiconductor) in an existing power management integrated circuit (PMIC), related defects of the LDMOS may be avoided to a large extent, such that power supply loss of the power supply circuit may be reduced, and thus power supply efficiency of the power supply circuit may be enhanced.

Figure 2:
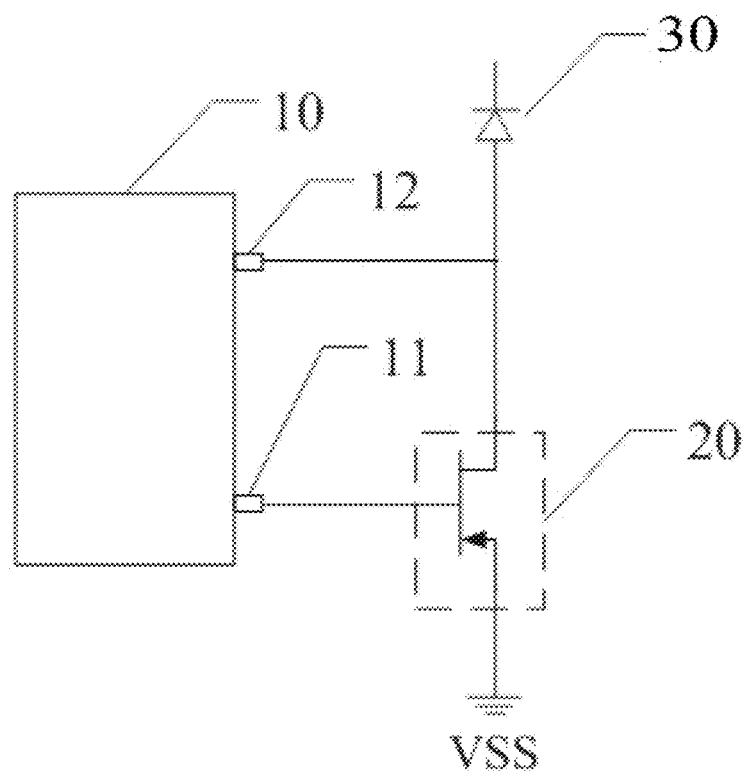
FIG. 2 is schematic diagram II of a power supply circuit according to an exemplary arrangement of the present disclosure.
Figure 3:
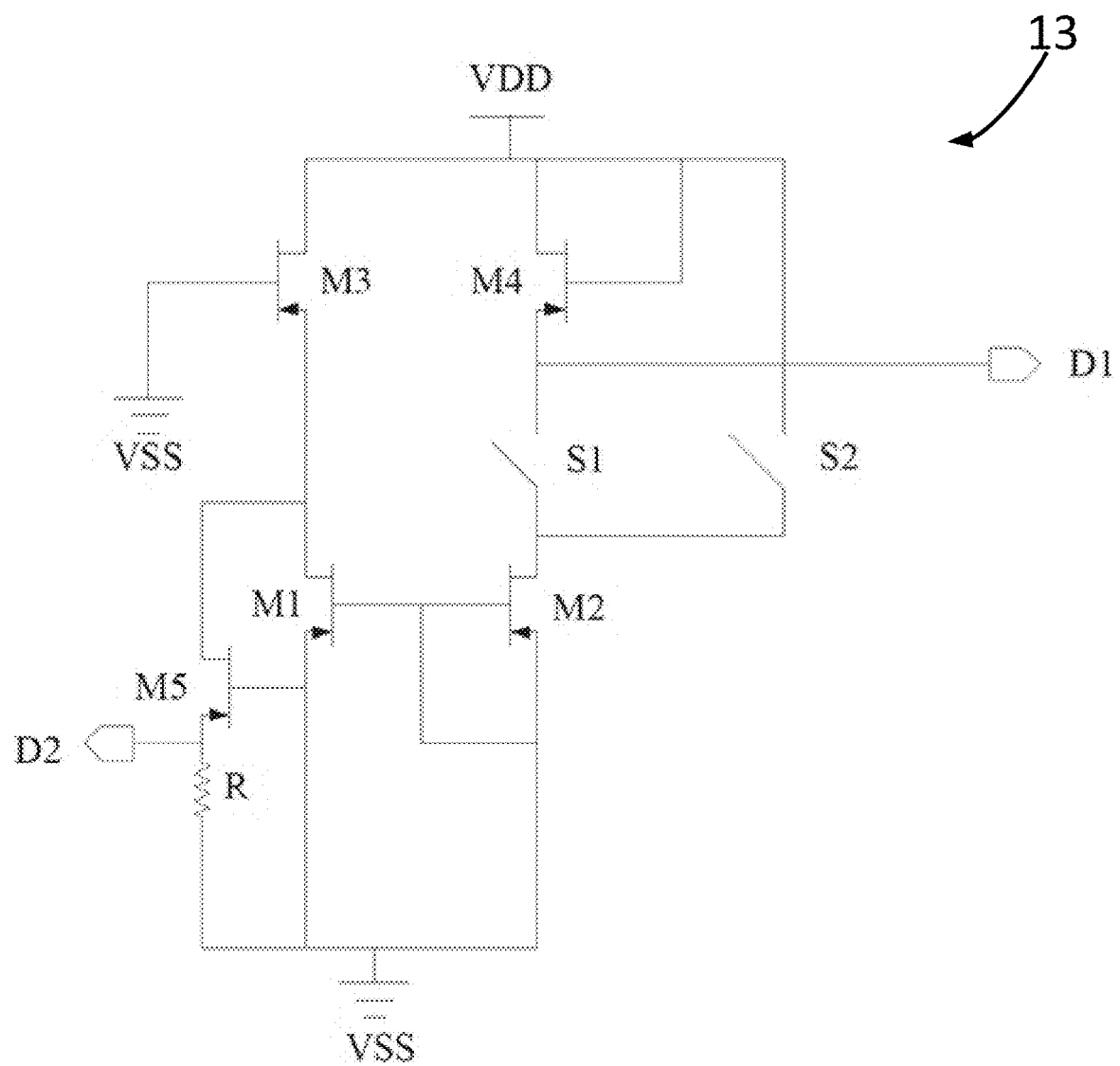
FIG. 3 is a schematic diagram of a detecting circuit according to an exemplary arrangement of the present disclosure.

Moreover, referring to FIG. 2 and FIG. 3, the power management integrated circuit (PMIC) 10 may further include a detecting pin 12 and a detecting circuit 13.

The detecting pin 12 is connected to the second terminal of the power transistor 20. A current detecting terminal D1 of the detecting circuit 13 is connected to the detecting pin 12 to detect a current flowing through the power transistor 20.

In this exemplary arrangement, the detecting circuit 13 is positioned in the power management integrated circuit (PMIC) 10 and is integrated on the power management integrated circuit (PMIC) 10. The detecting circuit 13 detects a current flowing through the power transistor 20 by means of the detecting pin 12 on the power management integrated circuit (PMIC) 10.

Further, as shown in FIG. 3, the detecting circuit 13 may include a current mirror circuit, which may include a first transistor M1 and a second transistor M2. Both a control terminal and a first terminal of the first transistor M1 are connected to the first power source VSS. Both a control terminal and a first terminal of the second transistor M2 are connected to the first power source VSS.

In this exemplary arrangement, the first transistor M1 and the second transistor M2 may be equal in size, such that the current flowing through the first transistor M1 is equal in intensity to that flowing through the second transistor M2.

Both the first transistor M1 and the second transistor M2 may be field-effect transistors or may be bipolar transistors.

Furthermore, both the first transistor M1 and the second transistor M2 may be enhancement mode transistors or may be depletion-type transistors, which is not particularly limited in this exemplary arrangement.

Both the first transistor M1 and the second transistor M2 have a control terminal, a first terminal, and a second terminal. For example, the control terminal of each transistor may be a gate, the first terminal of each transistor may be a source, and the second terminal of each transistor may be a drain.

The first power source VSS outputs a high level if both the first transistor M1 and the second transistor M2 are P-type thin-film transistors. The first power source VSS outputs a low level if both the first transistor M1 and the second transistor M2 are N-type thin-film transistors. It is to be noted that the P-type thin-film transistor is turned on when the gate is at a low level and is turned off when the gate is at a high level; and the N-type thin-film transistor is turned off when the gate is at a low level and is turned on when the gate is at a high level.

Further, the detecting circuit 13 may further include a third transistor M3, a first switch S1, a fourth transistor M4, a second switch S2, a fifth transistor M5, and a resistor R.

A control terminal of the third transistor M3 is connected to the first power source VSS, a first terminal of the third transistor M3 is connected to a second terminal of the first transistor M1, and a second terminal of the third transistor M3 is connected to a second power source VDD.

A first terminal of the first switch S1 is connected to a second terminal of the second transistor M2, and a second terminal of the first switch S1 is connected to the current detecting terminal D1 of the detecting circuit 13.

Both a control terminal and a second terminal of the fourth transistor M4 are connected to the second power source VDD, and a first terminal of the fourth transistor M4 is connected to the current detecting terminal D1 of the detecting circuit 13.

A first terminal of the second switch S2 is connected to the second terminal of the second transistor M2, and a second terminal of the second switch S2 is connected to the second power source VDD.

A control terminal of the fifth transistor M5 is connected to the first terminal of the first transistor M1, a first terminal of the fifth transistor M5 is connected to a voltage detecting terminal D2 of the detecting circuit 13, and a second terminal of the fifth transistor M5 is connected to the second terminal of the first transistor M1.

A first terminal of the resistor R is connected to the first power source VSS, and a second terminal of the resistor R is connected to the voltage detecting terminal D2 of the detecting circuit 13.

In this exemplary arrangement, all of the third transistor M3, the fourth transistor M4 and the fifth transistor M5 may be field-effect transistors or may be bipolar transistors. Furthermore, the third transistor M3, the fourth transistor M4 and the fifth transistor M5 may be enhancement mode transistors or may be depletion-type transistors, which is not particularly limited in this exemplary arrangement.

The third transistor M3, the fourth transistor M4 and the fifth transistor M5 respectively have a control terminal, a first terminal, and a second terminal. For example, the control terminal of each transistor may be a gate, the first terminal of each transistor may be a source, and the second terminal of each transistor may be a drain.

All of the third transistor M3, the fourth transistor M4 and the fifth transistor M5 may be N-type thin-film transistors, or all of them may be P-type thin-film transistors. It is to be noted that the P-type thin-film transistor is turned on when the gate is at a low level and is turned off when the gate is at a high level; and the N-type thin-film transistor is turned off when the gate is at a low level and is turned on when the gate is at a high level.

Moreover, a proportion of the size of the third transistor M3 to that of the fourth transistor M4 is N. N>0 and N is determined by a ratio of a width-to-length ratio of the third transistor to that of the fourth transistor.

The first switch S1 and the second switch S2 may be devices having switching function such as diodes. The first switch S1 and the second switch S2 respectively have a first terminal and a second terminal. For example, the first terminal may be a cathode, and the second terminal may be an anode. For another example, the first terminal may be an anode, and the second terminal may be a cathode.

The resistor R may be, for example, a polyresistor, a metallic resistor, a well resistor, an implanted resistor or the like, which is not particularly limited in this exemplary arrangement.

Further, a state of the detecting circuit 13 may include a detection state and a wait state. The first switch S1 is turned on and the second switch S2 is turned off when the detecting circuit 13 is in the detection state. The first switch S1 is turned off and the second switch S2 is turned on when the detecting circuit 13 is in the wait state.

Description is respectively made below to the detection state and the wait state of the detecting circuit 13 with reference to FIG. 3.

The first switch S1 is turned on and the second switch S2 is turned off when the detecting circuit 13 is in the detection state. At this moment, a circuit where the second transistor M2 and the fourth transistor M4 are is on. The first transistor M1 and the second transistor M2 are equal in size, and the first transistor M1 and the second transistor M2 constitute a current mirror circuit. Therefore, the current flowing through the first transistor M1 is equal in intensity to that flowing through the second transistor M2.

On this basis, the voltage between the control terminal and the first terminal of the first transistor M1 is equal to that between the control terminal and the first terminal of the second transistor M2. Therefore, the voltage between the second terminal and the first terminal of the first transistor M1 is equal to that between the second terminal and the first terminal of the second transistor M2. On this basis, both the first terminal of the first transistor M1 and the first terminal of the second transistor M2 are connected to the first power source VSS. Therefore, the voltage of the second terminal of the first transistor M1 is equal to that of the second terminal of the second transistor M2.

On this basis, a proportion of the size of the third transistor M3 to that of the fourth transistor M4 is N (i.e., the third transistor M3 and the fourth transistor M4 may be regarded as two transistors having a proportion of N), and the voltage of the second terminal of the first transistor M1 is equal to that of the second terminal of the second transistor M2. Therefore, the proportion of the current flowing through the fourth transistor M4 to that flowing through the fifth transistor M5 is N.

As shown in FIG. 3, the voltage of the first terminal of the fifth transistor M5 may be detected by means of the voltage detecting terminal D2 of the detecting circuit 13, and then the current flowing through the fifth transistor M5 may be calculated out. Next, the current flowing through the fourth transistor M4 may be calculated out based on the proportion N. The first terminal of the fourth transistor M4 is connected to the current detecting terminal D1 of the detecting circuit 13. Therefore, the current flowing through the power transistor 20 may be obtained by calculating out the current flowing through the fourth transistor M4.

The first switch S1 is turned off and the second switch S2 is turned on when the detecting circuit 13 is in the wait state. At this moment, the circuit constituted by the second transistor M2 and the fourth transistor M4 is disconnected. Therefore, the current flowing through the fourth transistor M4 cannot be detected, and thus the current flowing through the power transistor 20 cannot be detected.

In conclusion, the current flowing through the fourth transistor M4 may be detected by means of the detecting circuit 13, and then the current flowing through the power transistor 20 may be obtained. Furthermore, the power management integrated circuit (PMIC) 10 also may adjust the drive signal transmitted by the driving pin 11 based on the current flowing through the power transistor 20, such that the output voltage of the second terminal of the power transistor 20 remains stable. Moreover, the detecting circuit 13 is simple in structure and may be easily integrated into the power management integrated circuit (PMIC) 10.

This exemplary arrangement also provides a display apparatus, which includes the above power supply circuit. The display apparatus includes a plurality of scanning lines configured to provide scanning signals, a plurality of data lines configured to provide data signals, and a plurality of power supply circuits electrically connected to the scanning lines and the data lines. At least one of the power supply circuits includes any one of the above power supply circuits in this exemplary arrangement. The display apparatus may include any product or component having a display function, for example, a mobile phone, a tablet computer, a TV set, a notebook computer, a digital photo frame, a navigation device and so on.

It is to be noted that specific details of each modular unit in the display apparatus have been described in detail in the corresponding power supply circuit, and thus their detailed descriptions are omitted herein.

It is to be noted that although a plurality of modules or units of the device for action execution have been mentioned in the above detailed description, this partition is not compulsory. Actually, according to the arrangement of the present disclosure, features and functions of two or more modules or units as described above may be embodied in one module or unit. Reversely, features and functions of one module or unit as described above may be further embodied in more modules or units.

Other arrangements of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and arrangements be considered as exemplary only, with a true scope and spirit of the present disclosure being indicated by the appended claims.

What is claimed is:

1. A power supply circuit, comprising:
    a power management integrated circuit, comprising a driving pin configured to transmit a drive signal; and
    a power transistor with a control terminal connected to the driving pin, a first terminal connected to a first power source, and a second terminal connected to a load, the power transistor being configured to supply a voltage to the load,
    wherein the power management integrated circuit further comprises:
        a detecting pin, connected to the second terminal of the power transistor; and
        a detecting circuit with a current detecting terminal connected to the detecting pin, the detecting circuit being configured to detect a current flowing through the power transistor, wherein the detecting circuit comprises a current mirror circuit, and the current mirror circuit comprises:
        a first transistor with a control terminal and a first terminal both connected to the first power source; and
        a second transistor with a control terminal and a first terminal both connected to the first power source, and
        the detecting circuit further comprises:
        a third transistor with a control terminal connected to the first power source, a first terminal connected to a second terminal of the first transistor, and a second terminal connected to a second power source;
        a first switch with a first terminal connected a second terminal of the second transistor, and a second terminal connected to the current detecting terminal of the detecting circuit;
        a fourth transistor with a control terminal and a second terminal both connected to the second power source, and a first terminal connected to the current detecting terminal of the detecting circuit;
        a second switch with a first terminal connected to the second terminal of the second transistor, and a second terminal connected to the second power source;
        a fifth transistor with a control terminal connected to the first terminal of the first transistor, a first terminal connected to a voltage detecting terminal of the detecting circuit, and a second terminal connected to the second terminal of the first transistor; and
        a resistor with a first terminal connected to the first power source, and a second terminal connected to the voltage detecting terminal of the detecting circuit.

2. The power supply circuit according to claim 1, wherein a state of the detecting circuit comprises a detection state and a wait state;
    the first switch is turned on and the second switch is turned off in the detection state; and
    the first switch is turned off and the second switch is turned on in the wait state.

3. The power supply circuit according to claim 1, wherein the first transistor and the second transistor are equal in size.

4. The power supply circuit according to claim 1, wherein a proportion of a size of the third transistor to a size of the fourth transistor is N, wherein N>0 and N is determined by a ratio of a width-to-length ratio of the third transistor to that of the fourth transistor.

5. The power supply circuit according to claim 1, wherein all of the first transistor, the second transistor, the third transistor, the fourth transistor and the fifth transistor are N-type thin-film transistors or P-type thin-film transistors.

6. The power supply circuit according to claim 1, wherein the power transistor is an N-type power transistor or a P-type power transistor.

7. The power supply circuit according to claim 1, wherein the drive signal transmitted by the driving pin is a pulse waveform having a variable duty cycle.

8. The power supply circuit according to claim 7, wherein the power management integrated circuit is configured to control an output voltage of the second terminal of the power transistor by adjusting the duty cycle of the drive signal.

9. A display apparatus, comprising a power supply circuit, wherein the power supply circuit comprises:
   a power management integrated circuit, comprising a driving pin configured to transmit a drive signal; and
   a power transistor with a control terminal connected to the driving pin, a first terminal connected to a first power source, and a second terminal connected to a load, the power transistor being configured to supply a voltage to the load,
   wherein the power management integrated circuit further comprises:
   a detecting pin, connected to the second terminal of the power transistor; and
   a detecting circuit with a current detecting terminal connected to the detecting pin, the detecting circuit being configured to detect a current flowing through the power transistor,
   the detecting circuit comprises a current mirror circuit, and the current mirror circuit comprises:
   a first transistor with a control terminal and a first terminal both connected to the first power source; and
   a second transistor with a control terminal and a first terminal both connected to the first power source,
   the detecting circuit further comprises:
   a third transistor with a control terminal connected to the first power source, a first terminal connected to a second terminal of the first transistor, and a second terminal connected to a second power source;
   a first switch with a first terminal connected a second terminal of the second transistor, and a second terminal connected to the current detecting terminal of the detecting circuit;
   a fourth transistor with a control terminal and a second terminal both connected to the second power source, and a first terminal connected to the current detecting terminal of the detecting circuit;
   a second switch with a first terminal connected to the second terminal of the second transistor, and a second terminal connected to the second power source;
   a fifth transistor with a control terminal connected to the first terminal of the first transistor, a first terminal connected to a voltage detecting terminal of the detecting circuit, and a second terminal connected to the second terminal of the first transistor; and
   a resistor with a first terminal connected to the first power source, and a second terminal connected to the voltage detecting terminal of the detecting circuit.

10. The display apparatus according to claim 9, wherein a state of the detecting circuit comprises a detection state and a wait state;
   the first switch is turned on and the second switch is turned off in the detection state; and
   the first switch is turned off and the second switch is turned on in the wait state.

11. The display apparatus according to claim 9, wherein the first transistor and the second transistor are equal in size.

12. The display apparatus according to claim 9, wherein a proportion of a size of the third transistor to a size of the fourth transistor is N, wherein N>0 and N is determined by a ratio of a width-to-length ratio of the third transistor to that of the fourth transistor.

13. The display apparatus according to claim 9, wherein all of the first transistor, the second transistor, the third transistor, the fourth transistor and the fifth transistor are N-type thin-film transistors or P-type thin-film transistors.

14. The display apparatus according to claim 9, wherein the power transistor is an N-type power transistor or a P-type power transistor.

* * * * *